United States Patent
Kim

(10) Patent No.: US 8,923,061 B2
(45) Date of Patent: Dec. 30, 2014

(54) PROGRAMMING METHOD OF NONVOLATILE MEMORY DEVICE

(71) Applicant: SK hynix Inc., Gyeonggi-do (KR)

(72) Inventor: Tae-Gyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 91 days.

(21) Appl. No.: 13/773,291

(22) Filed: Feb. 21, 2013

(65) Prior Publication Data

US 2014/0063966 A1    Mar. 6, 2014

(30) Foreign Application Priority Data

Aug. 30, 2012   (KR) .................. 10-2012-0095673

(51) Int. Cl.
*G11C 16/04*      (2006.01)
*G11C 16/10*      (2006.01)

(52) U.S. Cl.
CPC ............ *G11C 16/10* (2013.01); *G11C 16/0483* (2013.01)
USPC ............. 365/185.18; 365/185.17; 365/185.19

(58) Field of Classification Search
USPC .............. 365/185.18, 185.17, 185.19, 185.03
See application file for complete search history.

(56) References Cited

U.S. PATENT DOCUMENTS 8,804,430 B2 *    8/2014   Lai et al. .................. 365/185.18

FOREIGN PATENT DOCUMENTS

KR        1020060099934        9/2006

* cited by examiner

*Primary Examiner* — David Lam
(74) *Attorney, Agent, or Firm* — IP & T Group LLP

(57) ABSTRACT

Provided is a programming method of a nonvolatile memory device which includes a plurality of strings each including a source select transistor, a plurality of memory cells, and a drain select transistor which are connected in series between a common source line and a bit line. The programming method includes: applying a first voltage to the common source line during a first period in which a channel of a plurality of memory cells of an unselected string is floated; and applying a second voltage increased more than the first in voltage to the common source line during a second period in which a selected memory cell is programmed, when a selected word line belongs to a word line group adjacent to the common source line.

8 Claims, 5 Drawing Sheets

PROGRAMMING METHOD OF NONVOLATILE MEMORY DEVICE

CROSS-REFERENCE TO RELATED APPLICATIONS

The present application claims priority of Korean Patent Application No. 10-2012-0095673, filed on Aug. 30, 2012, which is incorporated herein by reference in its entirety.

BACKGROUND

1. Field

Exemplary exemplary embodiments of the present invention relate to an operating method of a nonvolatile memory device, and more particularly, to a programming method of a nonvolatile memory device.

2. Description of the Conventional Art

Recently, the demand for nonvolatile memory devices which can be electrically programmed and erased and can maintain data even in a state where power is not supplied has rapidly increased. Among the nonvolatile memory devices, a NAND flash memory device includes a plurality of memory cells connected in series such that adjacent cells share a drain or source, and forming one string. Therefore, the NAND flash memory device is suitable for storing large information.

Specifically, a string forming a NAND flash memory device includes a drain select transistor, a plurality of memory cells, and a source select transistor, which are connected in series between a bit line and a common source line. The drain select transistor, the memory cells, and the source select transistor have gates connected to a drain select line, word lines, and a source select line, and controlled by the drain select line, the word lines, and the source select line, respectively. A plurality of strings and a plurality of bit lines connected to the respective strings form a memory cell block.

In order to program memory cells, an erase operation is performed on the memory cells such that the memory cells have a negative threshold voltage. Then, a high voltage as a program voltage is applied to a word line of a memory cell selected for programming such that the selected memory cell has a higher threshold voltage. At this time, the threshold voltages of the other unselected memory cells must not be changed.

During the program operation, however, a program voltage is applied to not only the selected memory cell, but also an unselected memory cell sharing a word line with the selected memory cell. Therefore, program disturbance may occur, in which the unselected memory cell connected to the selected word line is programmed. Conventionally, in order to prevent the program disturbance, the following method has been used: a drain select transistor and a source select transistor of an unselected string are turned off to float a channel of the memory cells of the unselected string, and a program voltage and a pass voltage are applied to a selected word line and an unselected word line to boost the channel voltage of the memory cells of the unselected string.

However, the conventional channel boosting method may not acquire a program disturbance prevention effect depending on the position of the selected memory cell. Specifically, when the selected memory cell is positioned at an end portion in the extension direction of the string, the program disturbance prevention effect may decrease. Hereafter, referring to FIGS. 1A and 1B, such a problem will be described in more detail.

FIGS. 1A and 1B are diagrams for explaining the problem of the conventional method. In particular, FIG. 1A is a cross-sectional view of an unselected string when a selected memory cell is the most adjacent to a common source line CSL, and FIG. 1B is a cross-sectional view of an unselected string when a selected memory cell is the most adjacent to a bit line BL.

Referring to FIG. 1A, a power supply voltage Vcc is applied to a common source line CSL, a drain select line DSL, and a bit line BL of an unselected string, and 0V is applied to a source select line SSL, thereby floating a channel of memory cells of the unselected string.

Subsequently, when a program voltage Vpgm is applied to a word line WL0 of the selected memory cell and a pass voltage Vpass is applied to the other word lines WL1 to WLn, channel voltages of the memory cells are boosted. At this time, since the program voltage Vpgm is higher than the pass voltage Vpass, the channel voltage CH1 boosted under the word line WL0 is larger than the channel voltages CH2 boosted under the other word lines WL1 to WLn.

In this case, since a difference between the channel voltage under the word line WL0 and the voltage Vcc applied to the adjacent common source line CSL is large, a leakage current may flow to the common source line CSL (refer to ①). Accordingly, the channel voltage under the word line WL0 decreases. That is, since the boosting degree of the channel voltage of the memory cell connected to the word line WL0 in the unselected string cannot be maintained, the corresponding memory cell may be programmed.

Furthermore, referring to FIG. 1B, a channel of memory cells of an unselected string is floated in the same manner as FIG. 1A.

Then, when a program voltage Vpgm is applied to a word line WLn of a selected memory cell and a pass voltage Vpass is applied to the other word lines WL0 to WLn−1 channel voltages of the memory cells are boosted. At this time, the channel voltage CH1 boosted under the word line WLn is higher than the channel voltages CH2 boosted under the other word lines WL0 to WLn−1.

In this case, since a difference between the channel voltage under the word line WLn and a voltage Vcc applied to an adjacent bit line BL is large, a leakage current may flow to the bit line BL (refer to ②). Accordingly, the channel voltage under the word line WLn decreases. That is, since the boosting degree of the channel voltage of the memory cell connected to the word line WLn in the unselected string cannot be maintained, the corresponding memory cell may be programmed.

SUMMARY

In accordance with an exemplary embodiment a programming method for a nonvolatile memory that includes a plurality of strings, each including a source select transistor, a plurality of memory cells, and a drain select transistor that are connected in series between a common source line and a bit line, includes: applying a first voltage to the common source line during a first period in which a channel of a plurality of memory cells of an unselected string is floated; and applying, when a selected word line belongs to a word line group adjacent to the common source line, a second voltage that is greater than the first voltage to the common source line during a second period in which a selected memory cell, of the plurality of memory cells, is programmed.

In accordance with an exemplary embodiment a programming method for a nonvolatile memory device that includes a plurality of strings, each including a source select transistor, a plurality of memory cells, and a drain select transistor that are connected in series between a common source line and a bit line, includes: applying a first voltage to an unselected bit line during a first period in which a channel of a plurality of memory cells of an unselected string is floated; and applying, when a selected word line belongs to a word line group adjacent to the bit line, a second voltage that is greater than the first voltage to the unselected bit line during a second period in which a selected memory cell is programmed.

In an exemplary embodiment of the present invention, a programming method for a nonvolatile memory device that includes a plurality of strings, each including a source select transistor, a plurality of memory cells, and a drain select transistor that are connected in series between a common source line and a bit line, includes: applying a first voltage to the common source line during a first period in which a channel of a plurality of memory cells of an unselected string is floated; applying a second voltage to an unselected bit line during the first period; applying, when a selected word line belongs to a first word line group adjacent to the common source line, a third voltage that is greater than the first voltage to the common source line during a second period in which a selected memory cell is programmed; and applying, when the selected word line belongs to a second word line group adjacent to the bit line, a fourth voltage that is greater than the second voltage to the unselected bit line during the second period.

DETAILED DESCRIPTION

Figure 1A:
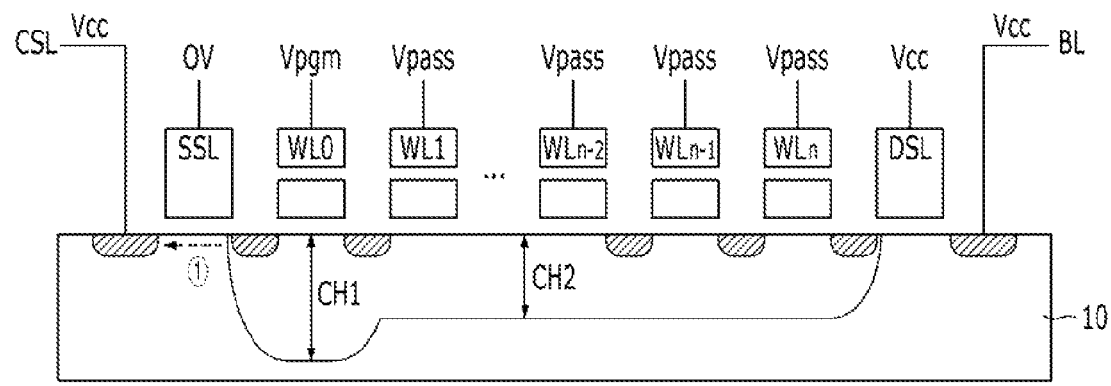
FIGS. 1A and 1B are diagrams for explaining the problem of a conventional method.
Figure 1B:
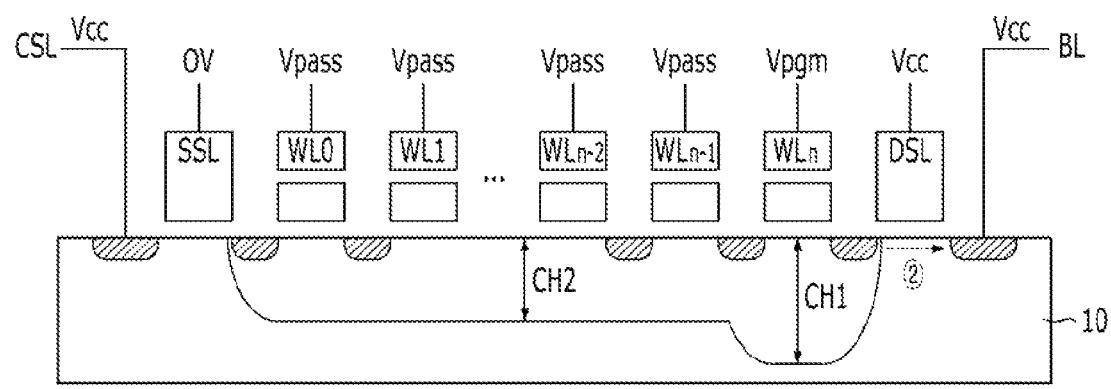

Exemplary exemplary embodiments of the present invention will be described below in more detail with reference to the accompanying drawings. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

Figure 2A:
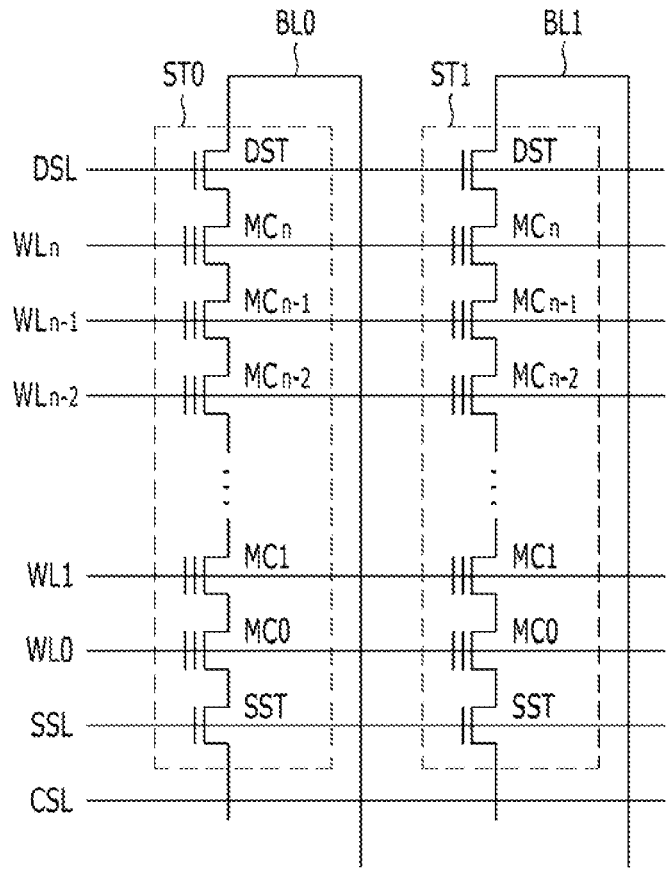
FIG. 2A is a circuit diagram illustrating a nonvolatile memory device in accordance with an exemplary exemplary embodiment.
Figure 2B:
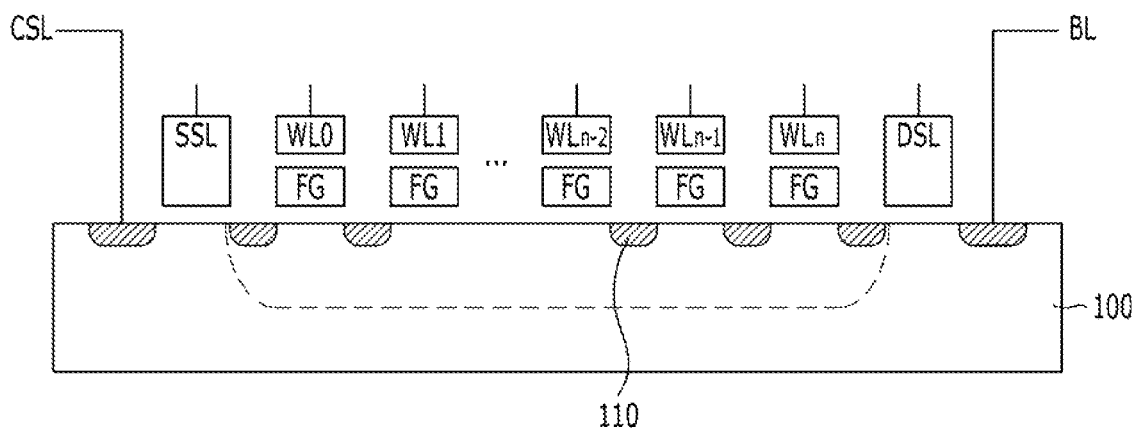
FIG. 2B is a cross-sectional view of one string of FIG. 2A.

FIG. 2A is a circuit diagram illustrating a nonvolatile memory device in accordance with an exemplary. FIG. 2B is a cross-sectional view of one string of FIG. 2A.

Referring to FIGS. 2A and 2B, an exemplary nonvolatile memory device includes a plurality of strings ST0 and ST1, each including a source select transistor SST, a plurality of memory cells MC0 to MCn, and a drain select transistor DST all of which are connected in series between a common source line CSL and a bit line BL0 or BL1. FIG. 2A illustrates two strings ST0 and ST1, but the present invention is not limited thereto. The number of strings and the number of bit lines connected to the respective strings may be changed. In FIGS. 2A and 2B, n represents a natural number indicating the number of word lines or the number of memory cells included in each of the strings ST0 and ST1.

The drain select transistor DST has a gate connected to a drain select line DSL extended in a direction (hereafter, second direction) crossing the extension direction (hereafter, first direction) of the strings ST0 and ST1, and is controlled by the drain select line DSL. The source select transistor SST has a gate connected to a source select line SSL extended in the second direction and is controlled by the source select line SSL.

Each of the memory cells MC0 to MCn has a stacked structure of a floating gate FG and a control gate. The control gates of the memory cells MC0 to MCn are connected to word lines WL0 to WLn extended in the second direction and controlled by the word lines WL0 to WLn, respectively. On the other hand, the floating gate FG has an island shape.

In FIG. 2B, reference numerals 100 and 110 represent a semiconductor substrate and a junction region, respectively. Furthermore, although not illustrated in FIG. 2B, a tunneling insulating layer is interposed between the floating gate FG and the semiconductor substrate 100 and an inter-gate insulating layer is interposed between the floating gate FG and the word lines WL0 to WLn.

Figure 3:
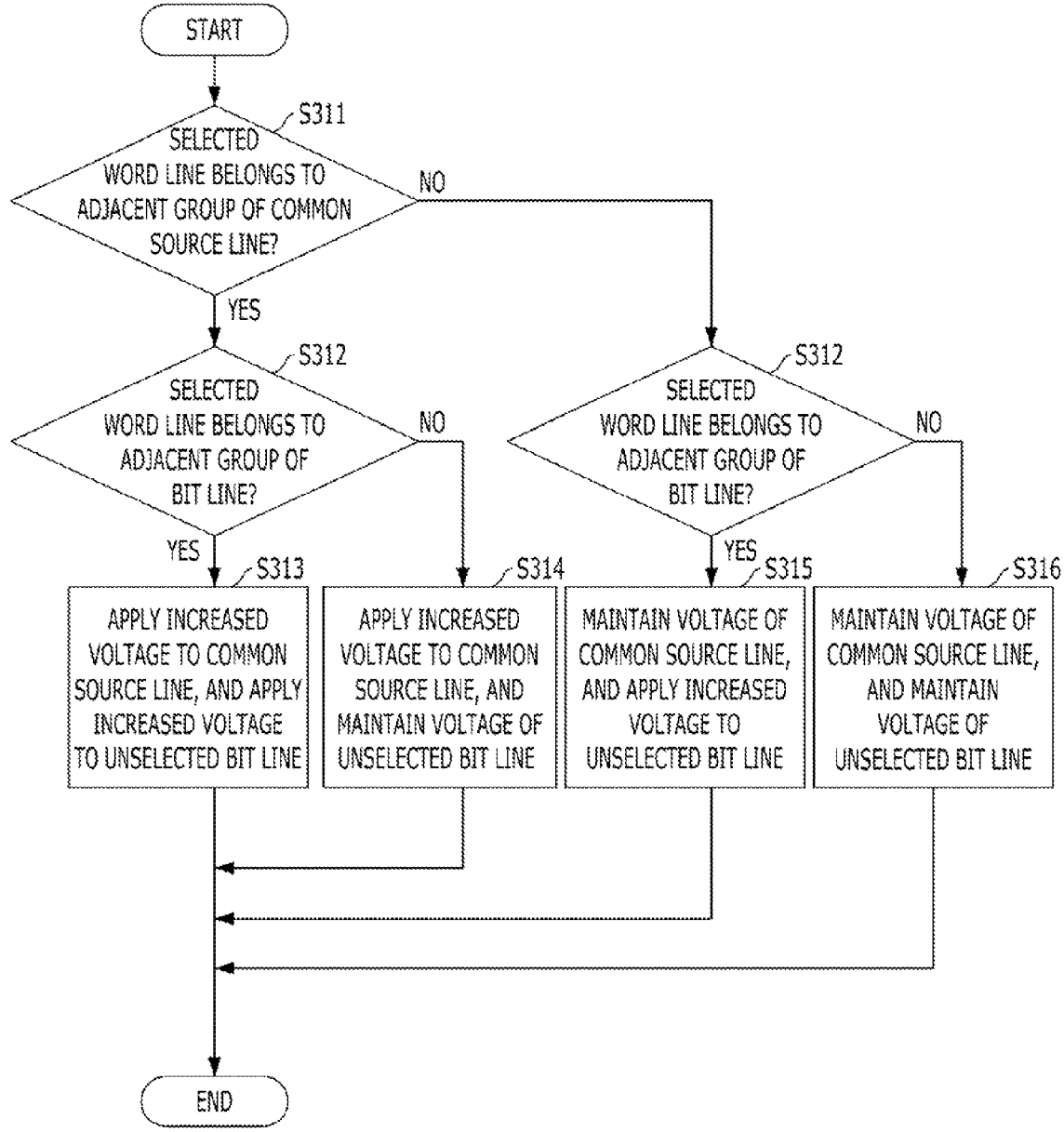
FIG. 3 is a flow chart for explaining a programming method of a nonvolatile memory device in accordance with an exemplary exemplary embodiment of the present invention.
Figure 4A:
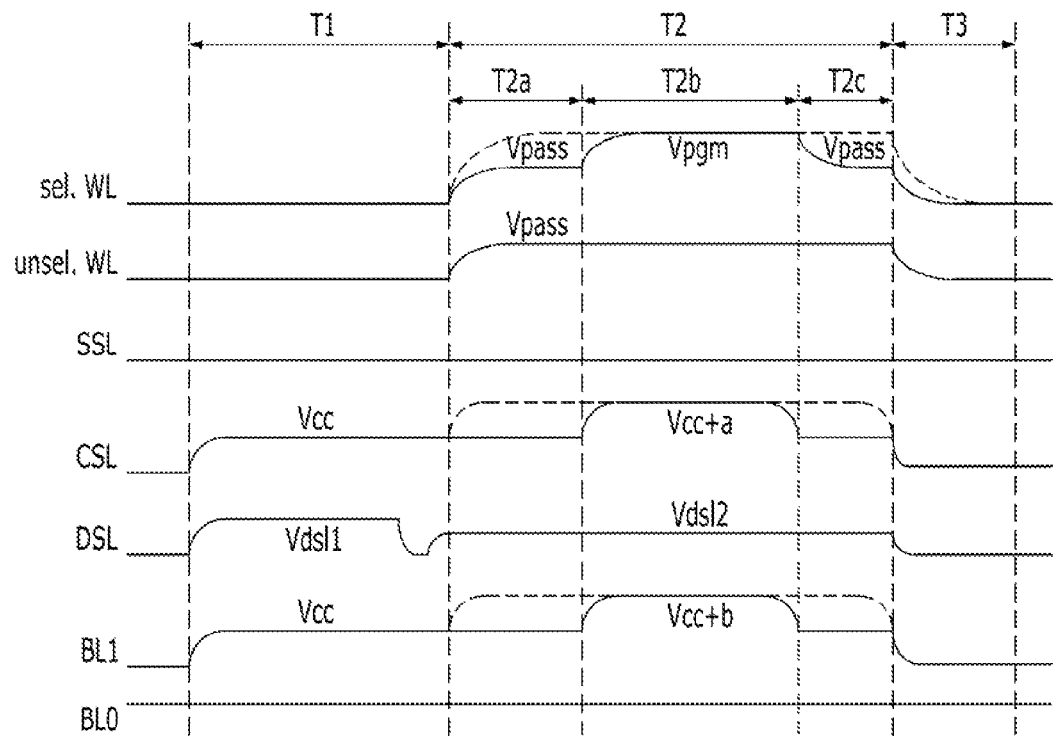
FIGS. 4A to 4D are timing diagrams for explaining steps S313 S314, S315A, and S316A of FIG. 3, respectively.
Figure 4B:
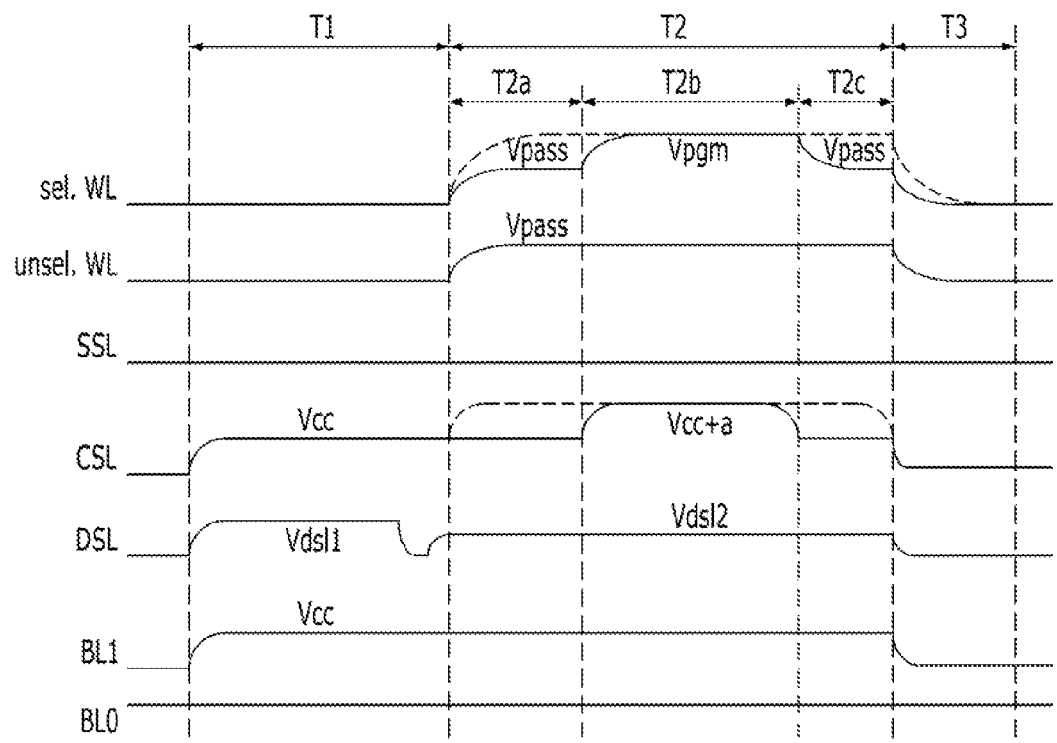
Figure 4C:
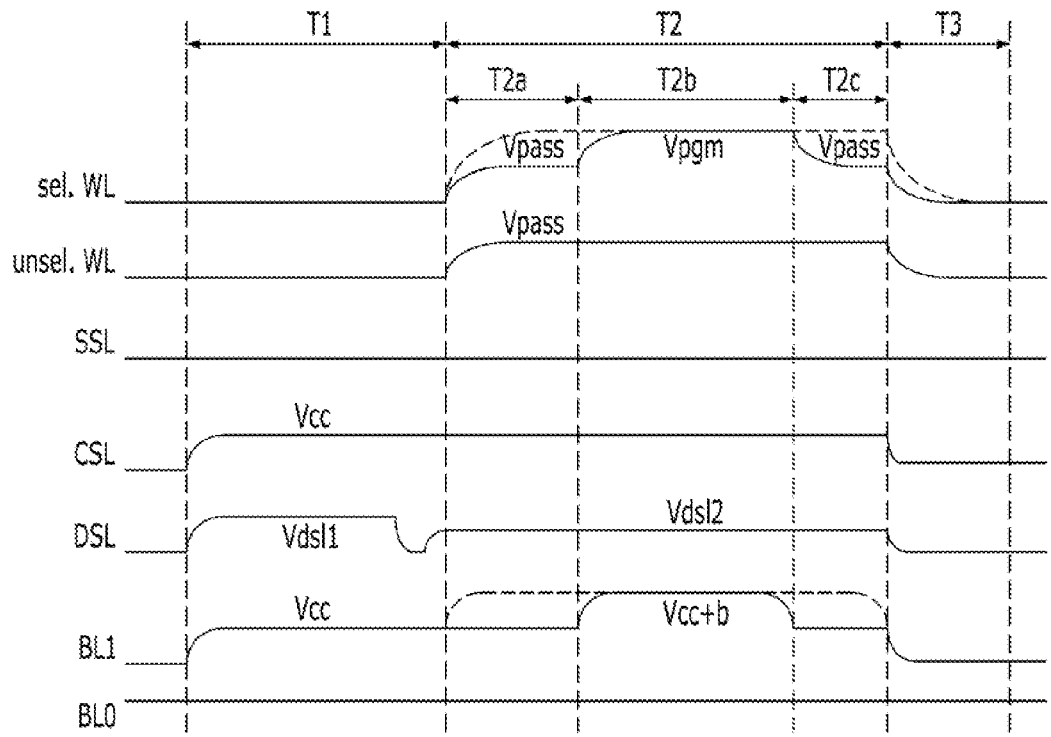
Figure 4D:
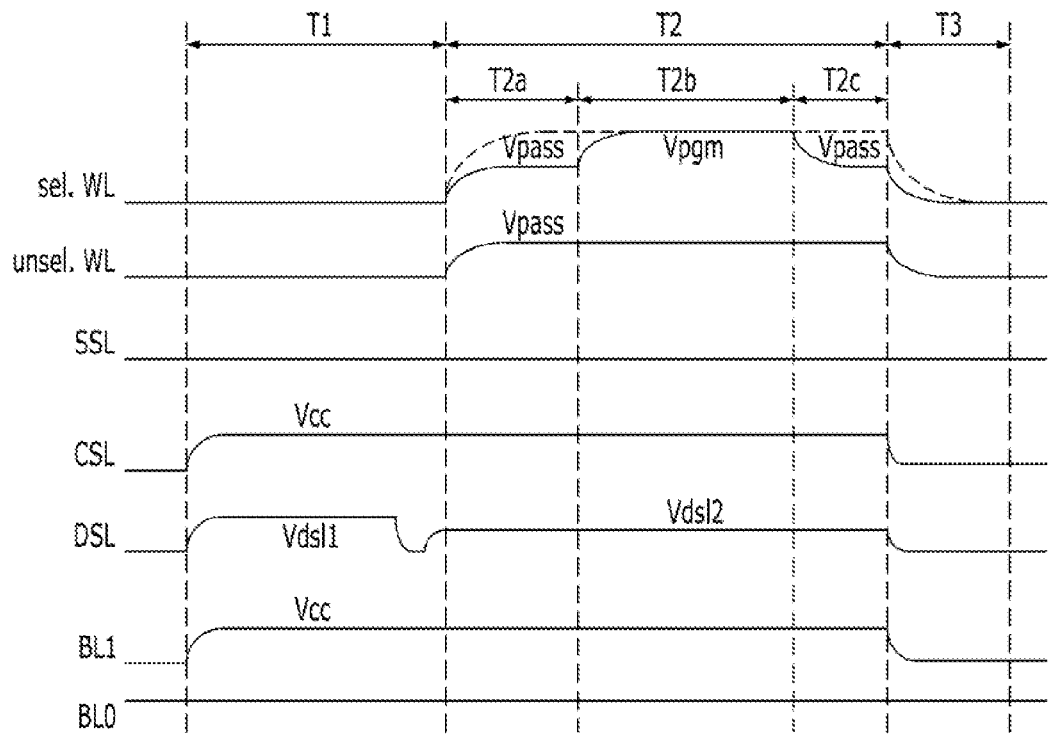

In the above-described nonvolatile memory device, the two strings ST0 and ST1 are divided into the selected string ST0 and the unselected string ST1, respectively, for convenience of description. The selected string ST1 is a string including a selected memory cell which is a program target, and the unselected string ST1 is a string including only a memory cell which must not be programmed, that is, an unselected memory cell. Furthermore, the bit line BL0 connected to the selected string ST0 is referred to as the selected bit line BL0, and the bit line BL1 connected to the unselected string ST1 is referred to as the unselected bit line BL1. Furthermore, a word line connected to the selected memory cell is referred to as a selected word line sel.WL, and word lines connected to the other memory cells are referred to as unselected word lines unsel.WL. Referring to FIGS. 3 to 4D, a programming method of the nonvolatile memory device in accordance with the exemplary embodiment of the present invention will be described as follows.

FIG. 3 is a flow chart for explaining a programming method of a nonvolatile memory device in accordance with an exemplary embodiment of the present invention. FIGS. 4A to 4D are tinning diagrams for explaining steps S313 S314, S315A, and S316A of FIG. 3, respectively.

Referring to FIG. 3, whether the selected word line sel.WL is adjacent to the common source line CSL or not is determined at step S311. At this time, whether the selected word line sel.WL is adjacent to the common source line CSL or not does not necessarily mean that the word line WL0 is the most adjacent to the common source line CSL, but may differ depending on settings. For example, one or more word lines arranged close to the common source line CSL among the word lines WL0 to WLn, that is word lines WL0 to WLk may be set to a group G1 adjacent to the common source line CSL, and the other word lines may be set to a group G2 which is not adjacent to the common source line CSL. Hereafter, the group G1 is referred to as an adjacent group, and the group G2 is referred to as an unadjacent group. In this case, when the selected word line sel.WL belongs to the adjacent group G1, it is determined that the selected word line sel.WL is adjacent to the common source line CSL, and when the selected word line sel.WL belongs to the unadjacent group G2 it is determined that the selected word line sel.WL is not adjacent to the common source line CSL. Here, k may have any values as long as k is an integer ranging from 0 to n. That is, depending on settings, only the word line WL0 which is the most adjacent to the common source line CSL may belong to the adjacent group G1, and all of the word lines WL0 to WLn may belong to the adjacent group G1.

Furthermore, whether the selected word line sel.WL is adjacent to the bit lines BL0 and BL1 or not is determined at step S312. At this time, whether the selected word line sel.WL is adjacent to the bit lines BL0 and BL1 or not does not necessarily mean that the word line WLn is the most adjacent to the bit lines BL0 and BL1, but may differ depending on settings. For example, one or more word lines arranged close to the bit lines BL0 and BL1 among the word lines WL0 to WLn, that is, word lines WLn to WLm may be set to a group G3 adjacent to the bit lines BL0 and BL1, and the other word lines may be set to a group G4 which is not adjacent to the bit lines BL0 and BL1. Hereafter, the group G3 is referred to as an adjacent group G3, and the group G4 is referred to as an unadjacent group G4. In this case, when the selected word line sel.WL belongs to the adjacent group G3, it is determined that the selected word line sel.WL is adjacent to the bit lines BL0 and BL1, and when the selected word line sel.WL belongs to the unadjacent group G4, it is determined that the selected word line sel.WL is not adjacent to the bit lines BL0 and BL1. Here, m may have any values as long as m is an integer ranging from 0 to n. That is, depending on settings, only the word line WLn which is the most adjacent to the bit lines BL0 and BL1 may belong to the adjacent group G3, or all of the word lines WL0 to WLn may belong to the adjacent group G3.

The determination of step S311 and the determination of steps S312 are performed independently of each other, and k and m are decided regardless of each other. In other words, whether the selected word line sel.WL belongs to the adjacent group G3 of the bit lines BL0 and BL1 or not has nothing to do with whether the selected word line sel.WL belongs to the adjacent group G3 of the bit lines BL0 and BL1 or not. Therefore, steps S312 may be first performed, and step S311 may be then performed.

According to the determination results of step S311 and steps S312, four cases are derived. The first case is where the selected word line sel.WL belongs to the adjacent group G1 of the common source line CSL and the adjacent group G3 of the bit lines BL0 and BL1. The second case is where the selected word line sel.WL belongs to the adjacent group G1 of the common source line CSL and does not belong to the adjacent group G3 of the bit lines BL0 and BL1. The third case is where the selected word line sel.WL does not belong to the adjacent group G1 of the common source line CSL and belongs to the adjacent group G3 of the bit lines BL0 and BL1. The fourth case where the selected word line sel.WL does not belong to the adjacent group G1 of the common source line CSL and does not belong to the adjacent group G3 of the bit lines BL0 and BL1.

First, in the second case, while the selected memory cell is programmed, the voltage of the common source line CSL is increased at step S314. The reason why the voltage of the common source line CSL is increased is in order to prevent a leakage current from flowing to the common source line CSL, because the selected word line sel.WL is adjacent to the common source line CSL. Referring to FIG. 4B the specific program operation will be described as follows.

Referring to FIG. 4B, a first period T1 in which the channels of the strings ST0 and ST1 are precharged is provided before a second period in which the selected memory cell is programmed.

During the first period T1, a ground voltage of 0V is applied to the source select line SSL to turn off the source select transistor SST, thereby blocking connection between the strings ST0 and ST1 and the common source line CSL. At this time, a predetermined positive voltage, for example, a power supply voltage Vcc is applied to the common source line CSL, in order to prevent a leakage current from flowing through the common source line CSL.

Furthermore, a first drain select line voltage Vdsl1, for example, the power supply voltage Vcc is applied to the drain select line DSL. At this time, a relatively low bit line program voltage, for example, 0V is applied to the selected bit line BL0 to turn on the drain select transistor DST of the selected string ST0. Accordingly, the channel of the selected string ST0 is precharged to a low voltage. On the other hand, a relatively high bit line program inhibit voltage, for example, the power supply voltage Vcc is applied to the unselected bit line BL1 to turn off the drain select transistor DST of the unselected string ST1. As both of the source select transistor SST and the drain select transistor DST of the unselected string ST1 are turned off, the channel of the memory cells MC0 to MCn of the unselected string ST1 becomes in a floating state.

In an exemplary exemplary embodiment, the first drain select line voltage Vdsl1 is dropped to some extent immediately before the first period T1 is ended, and then increased to a second drain select line voltage Vdsl2 having a value equal to or less than the first drain select line voltage Vdsl1, in order to reliably set the floating states of the memory cells MC0 to MCn of the unselected string ST1. However, the present invention is not limited thereto. When the first and second drain select line voltages Vdsl1 and Vdsl2 are equal to each other, the first drain select line voltage Vdsl1 is not dropped, but may be maintained at a constant voltage, for example, the power supply voltage Vcc during the first period T1. Alternatively, when the second drain select line voltage Vdsl2 is less than the first drain select line voltage Vdsl1, the first drain select line voltage Vdsl1 may be gently decreased to the second drain select line voltage Vdsl2 immediately before the first period T1 is ended. At this time, even when the second drain select line voltage Vdsl2 is less than the first drain select line voltage Vdsl1, a voltage to turn on the drain select transistor DST of the selected string ST0 and turn off the drain select transistor DST of the unselected string ST1 has a value more than 0V and less than the power supply voltage Vcc.

During the second period T2 in which the selected memory cell is programmed, a pass voltage Vpass is applied to the unselected word line unsel.WL and a program voltage Vpgm is applied to the selected word line sel.WL.

In this exemplary embodiment of the present invention, the second period T2 is divided into three periods T2a, T2b, and T2c, and a voltage applied to the selected word line sel.WL is increased or decreased in a stepwise manner during the periods. Specifically, the voltage applied to the selected word line sel.WL is increased to the pass voltage Vpass during the period T2a, then increased to the in program voltage Vpgm during the period T2b, and then decreased to the pass voltage Vpass during the period T2c. However, the present invention is not limited thereto, but the voltage applied to the selected word line sel.WL may be directly increased to the program voltage Vpgm during the second period T2 and then maintained until the second period T2 is ended (refer to a dotted line). Hereafter, for convenience of description, the periods T2a and T2c are referred to as first and second pass voltage application periods, respectively, and the period T2b is referred to as a program voltage application period.

According to the application of the pass voltage Vpass and the program voltage Vpgm, the channel voltage of the memory cells MC0 to MCn of the unselected string ST1 in a floating state is boosted. However, due to a difference between the boosted channel voltage and the voltage applied to the common source line CSL, a leakage current may flow to the common source line CSL. Such a phenomenon becomes serious as the position of the selected word line sel.WL is dose to the common source line CSL. In order to prevent such a phenomenon, a voltage Vcc+a increased more than the voltage applied during the first period T1, for example, the power supply voltage Vcc is applied to the common source line CSL during the second period T2. FIG. 4B illustrates that the increased voltage Vcc+a is applied during the program voltage application period T2b, but the present invention is not limited thereto. The increased voltage Vcc+a may be applied during the first pass voltage application period T2a and/or the second pass voltage application period T2c in addition to the program voltage application period T2b (refer to a dotted line). When the program voltage Vpgm is applied to the selected word line sel.WL during the entire second period T2, the increased voltage Vcc+a may be applied to the common source line CSL during the entire second period T2.

During the second period T2, voltages applied to the drain select lien DSL, the bit lines BL0 and BL1, and the source select line SSL may be maintained.

Then, during the third period T3 in which program is ended, the application of voltages to the selected word line sel.WL, the unselected word line unsel.WL, the source select line SSL, the common source line CSL, the drain select line DSL, and the bit lines BL0 and BL1 is stopped.

In an exemplary exemplary embodiment, a difference between the boosted channel voltage of the memory cells MC0 to MCn of the unselected string ST1 and the voltage applied to the common source line CSL may be reduced during the second period T2. Therefore, the memory cells MC0 to MCn of the unselected string ST1, in particular, the memory cell connected to the selected word line sel.WL may be program-inhibited.

In the third case, while the selected memory cell is programmed, the voltage of the unselected bit line BL1 is increased at step S315. The reason why the voltage of the unselected bit line BL1 is increased is in order to prevent a leakage current from flowing to the unselected bit line BL1, because the selected word line sel.WL is adjacent to the bit lines BL0 and BL1. Referring to FIG. 4C, the specific program operation will be described as follows. The following descriptions will be focused on a difference from those described with reference to FIG. 4B.

Referring to FIG. 4C, a first period T1 in which the channels of the strings ST0 and ST1 are precharged is provided. Curing the first period T1, the channel of the memory cells MC0 to MCn of the unselected string ST1 is floated.

Then, during a second period T2 in which the selected memory cell is programmed, a pass voltage Vpass is applied to the unselected word line unsel.WL, and a program voltage Vpgm is applied to the selected word line sel.WL. Accordingly, the channel voltage of the memory cells MC0 to MCn of the unselected string ST1 in a floating state is boosted.

However, due to a difference between the boosted channel voltage of the memory cells MC0 to MCn of the unselected string ST1 and the voltage applied to the unselected bit line BL1, a leakage current may flow to the unselected bit line BL1. Such a phenomenon becomes serious as the position of the selected word line seL.WL is close to the bit lines BL0 and BL1. In order to prevent such a phenomenon, a voltage Vcc+b increased more than the voltage applied during the first period T1, for example, the power supply voltage Vcc is applied to the unselected bit line BL1 during the second period T2. FIG. 4C illustrates that the increased voltage Vcc+b is applied during the program voltage application period T2b, but the present invention is not limited. The increased voltage Vcc+b may be applied during the first pass voltage application period T2a and/or the second pass voltage application period T2c in addition to the program voltage application period T2b (refer to a dotted line). When the program Vpgm is applied to the selected word line sel.WL during the entire second period T2, the increased voltage Vcc+b may be applied to the unselected bit line BL1 during the entire period T2.

During the second period T2, the voltages applied to the drain select line DSL, the selected bit line BL0, the source select line SSL, and the common source line CSL may be maintained.

Then, program is ended during the third period T3.

In the above-described exemplary embodiment, a difference between the boosted channel voltage of the memory cells MC0 to MCn of the unselected string ST1 and the voltage applied to the unselected bit line BL1 may be reduced during the second period T2. Therefore, the memory cells MC0 to MCn of the unselected string ST1 in particular, the memory cell connected to the selected word line sel.WL may be program-inhibited.

In the first case, while the selected memory cell programmed, the voltage of the unselected bit line BL1 and the voltage of the common source line CSL are simultaneously increased at step S313. The reason why the voltage of the unselected bit line BL1 and the voltage of the common source line CSL are simultaneously increased is in order to prevent a leakage current from flowing to the unselected bit line BL1 because the selected word line sel.WL is adjacent to the bit lines BL0 and BL1, and to prevent a leakage current from flowing to the common source line CSL because the selected word line sel.WL is also adjacent to the common source line CSL. Referring to FIG. 4A, the specific program operation will be described as follows. The following descriptions will be focused on a difference from those described with reference to FIGS. 4B and 4C.

Referring to FIG. 4A, during the second period T2, a voltage Vcc+b increased more than the voltage applied to the unselected bit line BL1 during the first period T1, for example, the power supply voltage Vcc is applied, and a voltage Vcc+a increased more than the voltage applied to the common source line CSL during the first period for example, the power supply voltage Vcc is applied. The increased voltage Vcc+b or Vcc+a may be applied only during the program voltage application period T2b or during the first pass voltage application period T2a and/or the second pass voltage application period T2c in addition to the program voltage application period T2b (refer to a dotted line). When the program voltage Vpgm is applied to the selected word line sel.WL during the entire second period T2, the increased voltage Vcc+a may be applied to the common source line CSL, and the increased voltage Vcc+b may be applied to the unselected bit line BL1, during the entire second period T2.

During the second period T2, the voltages applied to the drain select line DSL, the select bit line BL0, and the source select line SSL may be maintained.

In an exemplary exemplary embodiment, a difference between the boosted channel voltage of the memory cells MC0 to MCn of the unselected string ST1 and the voltage applied to the unselected bit line BL1 and a difference between the boosted channel voltage of the memory cells MC0 to MCn of the unselected string ST1 and the voltage applied to the common source line CSL may be reduced. Therefore, the memory cells MC0 to MCn of the unselected string ST1, in particular, the memory cell connected to the selected word line sel.WL may be program-inhibited.

In the fourth case, while the selected memory cell programmed, the voltages of the unselected bit line BL1 and the common source line CSL are maintained at step S316. This is because, when it is determined that the selected word line sel.WL is neither adjacent to the bit lines BL0 and BL1 nor adjacent to the common source line CSL, a leakage current does not need to be prevented from flowing. Referring to FIG. 4D, the specific program operation will be described as follows. The following descriptions will be focused on a difference from those described with reference to FIGS. 4B and 4C.

Referring to FIG. 4D, during the second period T2, the same voltage as the voltage applied during the first period T1, for example, the power supply voltage Vcc is applied to the unselected bit line BL, and the same voltage as the voltage applied during the first period T1, for example, the power supply voltage Vcc is applied to the common source line CSL.

In the above-described exemplary embodiment, when an increase of the voltage applied to the common source line CSL is referred to as a first voltage increase a and an increase of the voltage applied to the unselected bit line BL1 is referred to as a second voltage increase b, the first and second voltage increases a and b may be equal to each other or different from each other. In an exemplary exemplary embodiment, it has been described that the first and second voltage increases a and b have a fixed value, but the present invention is not limited thereto. The first and second voltage increases a and b may have different values depending on the selected word line sel.WL.

First, the adjacent group G1 of the common source line CSL at step S311 of FIG. 3 may be divided into two or more sub-groups arranged from a side close to the common source line CSL, for example, a first sub-group G1, a second sub-group G2, . . . . At this time, the number of word lines belonging to each sub-group may be varied depending on settings.

Here, when the selected word line sel.WL belongs to a sub-group close to the common source line CLS among the sub-groups, the first voltage increase a may be increased. For example, suppose that 32 word lines WL0 to WL31 exist, the adjacent group G1 includes word lines WL0 to WL10, and the adjacent group G1 is divided into a first sub-group G11 including the word lines WL0 to WL3, a second sub-group G12 including the word lines WL4 to WL7, and a third sub-group G13 including the word lines WL8 to WL10. In this case, when the selected word line sel.WL belongs to the first sub-group G11, the second sub-group G12, and the third group G13, the first voltage increase a may be set to a1, a2, and a3, respectively, and an expression of a1>a2>a3 may be established.

Furthermore, the adjacent group G3 of the bit line BL0 and BL1 at the step S312 of FIG. 3 may be divided into two or more sub-groups arranged from a side close to the bit lines BL0 and BL1, for example, a first sub-group G31, a second sub-group G31, . . . . Similarly, the number of word lines belonging to each group may be varied.

Here, when the selected word line sel.WL belongs to a sub-group close to the bit lines BL0 and BL1 among the sub-groups, the second voltage increase b may be increased. For example, suppose that 32 word lines WL0 to WL31 exist, the adjacent group G3 includes word lines WL31 to WL20, and the adjacent group G3 is divided into a first sub-group G31 including the word lines WL31 to WL29, a second sub-group G32 including the word lines WL28 to WL25, and a third sub-group G33 including the word lines WL24 to WL20. In this case, when the selected word line sel.WL belongs to the first sub-group G31, the second sub-group G32, and the third group G33, the second voltage increase b may be set to b1, b2, and b3, respectively, and an expression of b1>b2>b3 may be established.

In an exemplary exemplary embodiment, as described with reference to FIGS. 3 to 4D, the increased voltage may be applied to the common source line CSL and/or the unselected bit line BL1 according to the position of the selected word line sel.WL, and the increase of the increased voltage may be controlled according to the position of the selected word line sel.WL.

In accordance with an exemplary exemplary embodiment, it is possible to effectively prevent program disturbance by considering the position of the selected memory cell.

While the present invention has been described with respect to the specific exemplary embodiments, it will be apparent to those skilled in the art that various changes and modifications may be made without departing from the spirit and scope of the invention as defined in the following claims.

What is claimed is:

1. A programming method for a nonvolatile memory device that includes a plurality of strings, each including a source select transistor, a plurality of memory cells, and a drain select transistor that are connected in series between a common source line and a bit line, the programming method comprising:
   applying a first voltage to the common source line during a first period in which a channel of a plurality of memory cells of an unselected string is floated;
   applying a second voltage to an unselected bit line during the first period;
   applying, when a selected word line belongs to a first word line group adjacent to the common source line, a third voltage that is greater than the first voltage to the common source line during a second period in which a selected memory cell is programmed; and
   applying, when the selected word line belongs to a second word line group adjacent to the bit line, a fourth voltage that is greater than the second voltage to the unselected bit line during the second period.

2. The programming method of claim 1, where the second period comprises:
   a program voltage application period in which a program voltage is applied to the selected word line,
   the third voltage is applied to the common source line during the program voltage application voltage, and
   the fourth voltage is applied to the unselected bit line during the program voltage application voltage.

3. The programming method of claim 1, where the second period comprises:
   a pass voltage application period in which a pass voltage is applied to the selected word line, and
   a program voltage application period in which a program voltage is applied to the selected word line, and
   where the third voltage is applied to the common source line during the program voltage application period, and
   where the fourth voltage is applied to the unselected bit line during the program voltage application period.

4. The programming method of claim 3, where the third voltage is applied to the common source line during the pass voltage application period, and
   the fourth voltage is applied to the unselected bit line during the pass voltage application period.

5. The programming method of claim 1, where the first word line group comprises:
   one or more word lines arranged from a side that is closest to the common source line, and the second word line group comprises one or more word lines arranged from a side which is the most adjacent to the bit line.

6. The programming method of claim 5, wherein the first and second word line groups are set independently of each other.

7. The programming method of claim 1, where the first word line group is divided into first to Nth sub-groups arranged from a side that is closest to the common source line, where N is a natural number equal to or more than one, where each of the first to Nth sub-groups comprises one or more word lines, and where the magnitude of the third voltage decreases from the first sub-group to the N-th sub-group among the sub-groups to which the selected word line belongs.

8. The programming method of claim 1, where the second word line group is divided into first to M-th sub-groups arranged from a side which is the most adjacent to the bit line where M is a natural number equal to or more than one, where each of the first to M-th sub-groups comprises one or more word lines, and where the magnitude of the fourth voltage decreases from the first sub-group to the M-th sub-group, among the sub-groups to which the selected word line belongs.

* * * * *